(12) United States Patent
Nascimento et al.

(10) Patent No.: US 9,143,115 B2
(45) Date of Patent: Sep. 22, 2015

(54) DELAY COMPENSATION CIRCUIT

(71) Applicant: Freescale Semiconductor, Inc., Austin, TX (US)

(72) Inventors: Ivan Carlos Ribeiro Nascimento, Campinas (BR); Andre Luis Vilas Boas, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/639,795

(22) Filed: Mar. 5, 2015

(65) Prior Publication Data

US 2015/0180454 A1 Jun. 25, 2015

Related U.S. Application Data

(62) Division of application No. 13/458,205, filed on Apr. 27, 2012, now Pat. No. 9,041,366.

(51) Int. Cl.
*G05F 1/00* (2006.01)
*H03K 3/012* (2006.01)
*H02M 1/08* (2006.01)

(52) U.S. Cl.
CPC *H03K 3/012* (2013.01); *H02M 1/08* (2013.01)

(58) Field of Classification Search
CPC ...... G05F 1/59; G05F 1/625; H03K 17/04123
USPC ................. 323/222, 225, 268, 271, 282, 283; 327/261, 262, 277, 276, 281
See application file for complete search history.

(56) References Cited

U.S. PATENT DOCUMENTS

| 7,443,254 | B2 | 10/2008 | Gong | |
| 7,449,869 | B2* | 11/2008 | Markowski | 323/283 |
| 7,847,648 | B2 | 12/2010 | Hu et al. | |
| 7,923,977 | B2 | 4/2011 | Huang | |
| 7,990,118 | B2* | 8/2011 | Feng et al. | 323/271 |
| 8,436,594 | B2* | 5/2013 | Fu et al. | 323/271 |
| 2010/0164638 | A1 | 7/2010 | Saw | |
| 2011/0204860 | A1 | 8/2011 | Thiele et al. | |
| 2014/0191735 | A1* | 7/2014 | Zhao | 323/271 |

OTHER PUBLICATIONS

Sander L. J. Gierkink and Ed (A. J. M.) Van Tuijl, "A Coupled Sawtooth Oscillator Combining Low Jitter With High Control Linearity", IEEE Journal of Solid-State Circuits, Jun. 2002, pp. 702-710, vol. 37, No. 6., IEEE, US.

(Continued)

*Primary Examiner* — Matthew Nguyen

(57) ABSTRACT

An integrated circuit includes a delay compensation circuit (221, 222) that further includes a terminal for receiving a varying signal from a circuit external to the integrated circuit; a sampler circuit that samples and holds a present value of the varying signal at each occurrence of a transition in a digital signal; an integrator, coupled to the sampler circuit, that integrates a voltage difference between a sample of the varying signal and a reference signal, and that outputs results of the integration, wherein a time constant of the integrator is greater than a period of the varying signal; a waveform generator that generates a decreasing voltage in response to a transition in a second digital signal; and a comparator that has one input terminal for receiving the decreasing voltage, an inverted input terminal for receiving the results, and an output terminal for outputting a signal that generates an output signal.

20 Claims, 8 Drawing Sheets

(56) References Cited

OTHER PUBLICATIONS

Yusuke Tokunaga, et al., "An On-Chip CMOS Relaxation Oscillator with Power Averaging Feedback Using a Reference Proportional to Supply Voltage", IEEE International Solid-State Circuits Conference, 2009, Session 23, PLLs and Clocks, 23.8., IEEE, US.

Gordon M. Jacobs, et al., "Design Techniques for MOS Switched Capacitor Ladder Filters", IEEE Transactions on Circuits and Systems, Dec. 1978, pp. 1014-1021, vol. CAS-25, No. 12., IEEE, US.

* cited by examiner

DELAY COMPENSATION CIRCUIT

CROSS REFERENCE TO RELATED APPLICATION

This is a divisional of application Ser. No. 13/458,205, filed Apr. 27, 2012, now U.S. Pat. No. 9,041,366, the entire disclosure of which is hereby incorporated by reference herein.

BACKGROUND

1. Field

This invention relates generally to delay compensation circuits, and more specifically a delay compensation circuit that can be used with a driver stage of a switched-mode power supply.

2. Related Art

A switched-mode power supply (hereinafter "SMPS") is a type of direct current voltage to direct current voltage converter that includes two power transistors in a push-pull configuration and an inductor coupled between the two power transistors and an output terminal of the SMPS.

A driver stage of a SMPS alternately switches the two power transistors on and off. To ensure that only one of the two power transistors are on at any moment, the driver stage creates a dead time that occurs during switching transitions. Dead time is defined as an interval during which both power transistors are off. The dead time occurs at each cycle during a period between when one power transistor turns off and the other power transistor turns on. The presence of the dead time avoids a situation where both power transistors are on simultaneously, which would cause a short circuit current and may also lead to failure of the power transistors. The dead time causes an output voltage of the SMPS to be clamped around −0.6V (one diode voltage drop) due to the effect of the inductor. The dead time inserts losses into the SMPS, and such losses become more significant when the output voltage of the SMPS is relatively low. For example, if a SMPS has an output voltage above 4V, the diode voltage drop during the dead time may not be a problem, but if a SMPS has an output voltage of 1.8V or less, the diode voltage drop during the dead time may compromise efficiency of the SMPS. A SMPS having an output voltage of 1.8V or less is used as a power supply for some microprocessors.

A high switching frequency of a SMPS allows components, such as inductors and capacitors, to be small in size and allows the SMPS to have a fast reaction time relative to changes in load current. Disadvantageously, the losses due to the dead time become more significant as the switching frequency is increased.

FIG. 1 illustrates a known device 100 comprising an output stage of a SMPS 102 coupled to a known driver stage 104. The known driver stage 104 comprises known switcher logic 106, an upper buffer 108, a lower buffer 110, a first comparator 121 and a second comparator 122. The first comparator 121 outputs, to the known switcher logic 106, an F_LATCHA signal. The second comparator 122 outputs, to the known switcher 106, an R_LATCHA signal. The SMPS 102 comprises an upper power transistor 131, a lower power transistor 132, an inductor 134 coupled between the power transistors, and an output terminal 140 of the SMPS, as illustrated in FIG. 1. The SMPS 102 also comprises diodes 135 and 136 that are inherently within power transistors 131 and 132, respectively. A load capacitor 137 and a load resistor 138 are coupled to the output terminal 140 of the SMPS 102.

A variable voltage SWA appears at a node 133 between the two power transistors 131 and 132. The inductor 134 is coupled between node 133 and the output terminal 140 of the SMPS 102. The inductor 134 affects the voltage at node 133. The first comparator 121 compares the SWA voltage with a fixed DC reference voltage $V_{REF}$, which is typically chosen to be slightly above 0V. The second comparator 122 compares the SWA voltage with a fixed DC reference voltage $V_{REFR}$, which is typically chosen to be slightly below 0V.

The known switcher logic 106 of the driver stage 104 generates W_VGUA and W_VGLA signals that are fed into the upper buffer 108 and the lower buffer 110, respectively, of the SMPS 102. The known switcher logic 106 generates the W_VGUA and W_VGLA signals based, in part, upon timing of the F_LATCHA signal from the first comparator 121 and the R_LATCHA signal from the second comparator 122.

The upper buffer 108 and the lower buffer 110 output VGUA and VGLA signals, respectively, that alternately turn on and off the two power transistors 131 and 132 such that only one power transistor is on at any moment. The VGUA signal alternately turns on and off the upper power transistor 131. The VGLA signal alternately turns on and off the lower power transistor 132.

Disadvantageously, the known driver stage 104 may be unable to reduce the dead time sufficiently enough for optimal efficiency.

Known driver stages, such as known driver stage 104, may increase the dead time when inherent delays associated with comparators and logic paths have a longer duration than the time of one sweep of the SWA voltage.

Furthermore, inherent delays associated with comparators and logic paths may vary with process, noise, temperature, $V_{DD}$ variation, clock and timing variation, part-to-part variation, and other random effects. The dead time of known driver stages, including known driver stage 104, may increase when such inherent delays are unknown and/or vary.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 2:
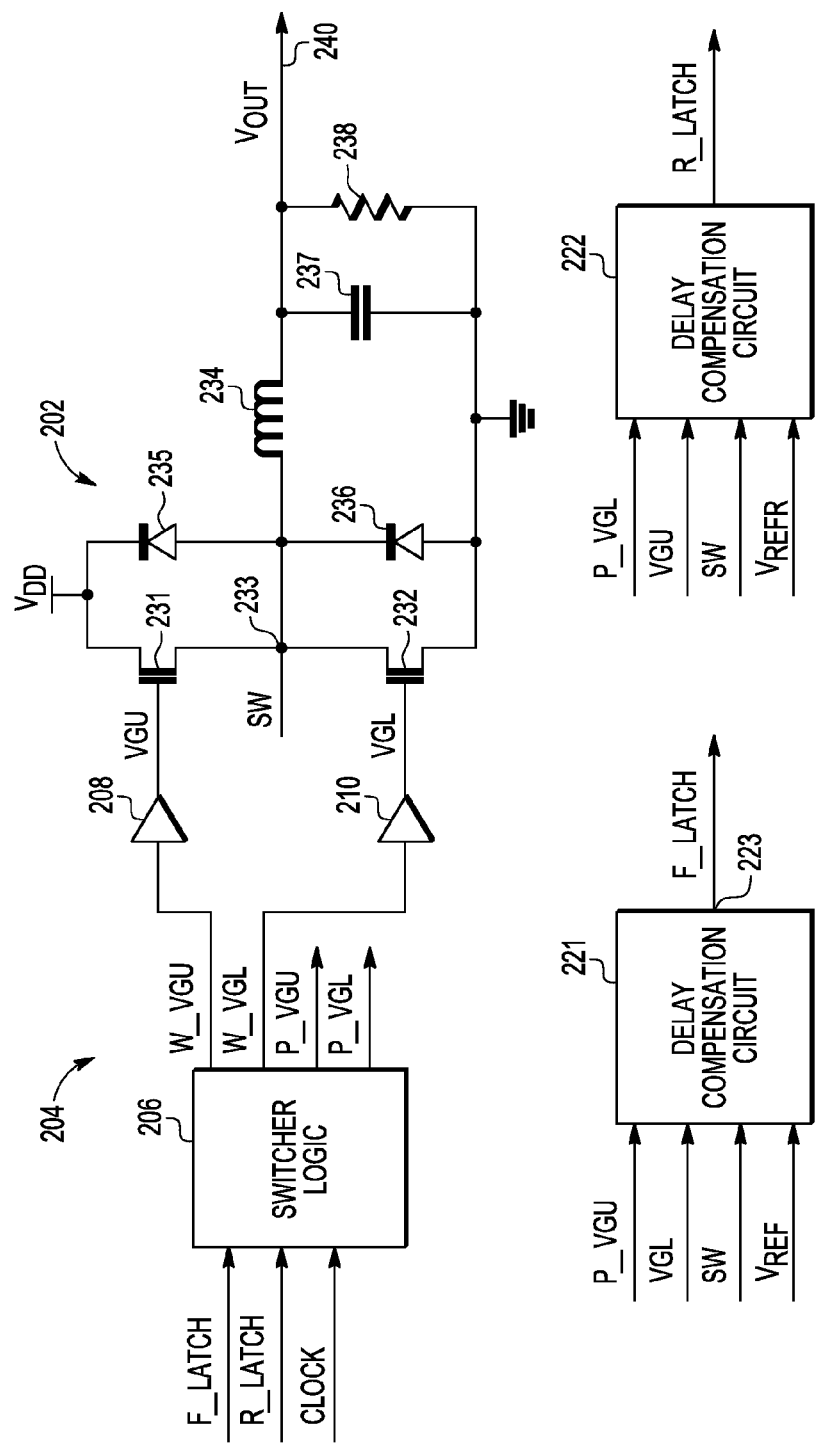
FIG. 2 is a simplified functional block diagram of a device in accordance with one embodiment of the invention, including an output stage of a switched-mode power supply and one embodiment of a driver stage therefor which includes switcher logic and a delay compensation circuit.

FIG. 2 illustrates a device 200 in accordance with one embodiment of the invention, which comprises an output stage of a switched-mode power supply (hereinafter "SMPS") 202 coupled to a driver stage 204 in accordance with the invention. The driver stage 204 comprises switcher logic 206 in accordance with the invention, an upper buffer 208, a lower buffer 210, a first delay compensation circuit 221 in accordance with the invention and a second delay compensation circuit 222 in accordance with the invention. In one embodiment, the driver stage 204, the first delay compensation circuit 221 and the second delay compensation circuit 222 are disposed on a circuit-supporting substrate of an integrated circuit. The upper buffer 208 and the lower buffer 210 may also be disposed on the circuit-supporting substrate of the integrated circuit.

The driver stage 204 implements a threshold locked loop (TLL) circuit. Advantageously, the TLL circuit in accordance with one embodiment of the invention can work with waveforms not suitable for the known driver stage 104, such as a waveform that has a very fast waveform sweep. Unlike known delay compensation circuits, the TLL circuit in accordance with one embodiment of the invention can work with another circuit, such as the output stage of the SMPS 202, that has a large delay for which to be compensated (large compared to a sweep of a waveform in the other circuit). Unlike known TLL circuits, the TLL circuit in accordance with one embodiment of the invention can work with another circuit, such as the output stage of the SMPS 202, that has a waveform with non-monotonic behavior close to a threshold point, $V_{REF}$. The phrase "close to a threshold point" means within a time interval less than or equal to a total delay within the device 200. When the voltage of the waveform is close to $V_{REF}$, the shape of the waveform should be the same for each successive cycle of the waveform. For example, if a waveform has a rising rate of 1V/1ns when the voltage of the waveform is close to $V_{REF}$, then the waveform should always have the same rising rate of 1V/1ns for each successive cycle of the waveform when the voltage of the waveform is close to $V_{REF}$. This condition ensures that a stable steady state is achievable.

The first delay compensation circuit 221 outputs, to the switcher logic 206, an F_LATCH signal. The second delay compensation circuit 222 outputs, to the switcher logic 206, an R_LATCH signal. The SMPS 202 comprises an upper power transistor 231, a lower power transistor 232, and an inductor 234 coupled between the power transistors, and an output terminal 240 of the SMPS, as illustrated in FIG. 2. In one embodiment, the inductor 234 has an inductance of 4.7 μH. The SMPS 202 also comprises diodes 235 and 236 that are inherently within power transistors 231 and 232, respectively. A load capacitor 237 and a load resistor 238 are coupled to the output terminal 240 of the SMPS 202, as illustrated in FIG. 2. In one embodiment of the device 200, VDD=3.3V, and VOUT=1.2V. A variable voltage SW appears at a node 233 between the two power transistors 231 and 232. In the one embodiment, the SW voltage has a maximum voltage of 3.3V and a minimum voltage slightly below 0V. The inductor 234 is coupled between node 233 and the output terminal 240 of the SMPS 202. The inductor 234 affects the SW voltage at node 233. In one embodiment, the upper power transistor 231 is an n-channel metal-oxide-semiconductor field-effect transistor (hereinafter "MOSFET") and the lower power transistor 232 is an n-channel MOSFET, and node 233 is coupled to a source terminal of upper power transistor 231 and to a drain terminal of lower power transistor 232.

Current through the inductor 234 changes with time directly proportionally to the voltage across it and inversely proportional to its inductance, i.e., $di_L/dt=V(t)/L$. When the upper power transistor 231 is on, the voltage across the inductor 234 is positive and the current through the inductor ramps up. When the lower power transistor 232 turns on, the voltage across the inductor 234 is negative and the current through the inductor ramps down. In despite of the ramping up and the ramping down, the current through the inductor 234 is positive most of the time and is sometimes zero, and, for good SMPS designs, the current through the inductor never ramps to negative values. When the upper power transistor 231 turns off and the lower power transistor 232 has not yet turned on, the current through the inductor 234 reaches its maximum value, and the inductor 234 makes the SW voltage go down in order to decrease the current through the inductor. The decreasing SW voltage cannot go below −0.6V because diode 236, which is inherently within the lower power transistor 232, turns on when SW=−0.6V, which is one diode voltage drop. With the known driver stage 104, the SWA voltage disadvantageously goes down to −0.6V during each dead time (see FIG. 6). The dead time is an interval during which both power transistors 231 and 232 are off. On the other hand, with the driver stage 204 in accordance with the invention, the SW voltage advantageously does not go down to −0.6V during the dead time, for the reason explained more fully hereinbelow (see FIG. 7). For inductance values and fast SW voltage sweeps that are typically used in the SMPS 202, the current through the inductor 234 may be considered constant during any given sweep of the SW voltage.

The switcher logic 206 of the driver stage 204 alternately generates digital W_VGU and W_VGL signals, which are fed into the upper buffer 208 and the lower buffer 210, respectively, of the SMPS 202. The switcher logic 206 is coupled to a clock circuit (not shown) that outputs a CLOCK signal. The switcher logic 206 cyclically generates the W_VGU and W_VGL signals at a frequency. The frequency of the W_VGU and W_VGL signals determines a frequency that the SW voltage sweeps through 0V. In one embodiment, the frequency that the SW voltage sweeps through 0V is 8 MHz. The upper buffer 208 and the lower buffer 210 delay the W_VGU and W_VGL signals, respectively. The upper buffer 208 and the lower buffer 210 also ensure that the analog VGU and VGL signals, respectively, have proper power and voltage levels to turn on the power transistors 231 and 232, respectively, at a required SMPS frequency. In one embodiment, such proper level is 6V. The switcher logic 206 generates the W_VGU and W_VGL signals based, in part, upon timing of the F_LATCH signal from the first delay compensation circuit 221 and the R_LATCH signal from the second delay compensation circuit 222. Unlike known switcher logics, such as switcher logic 106, the switcher logic 206 also generates a digital P_VGU signal for the first delay compensation circuit 221 and a digital P_VGL signal for the second delay compensation circuit 222. The switcher logic 206 advantageously generates the P_VGU and the P_VGL signals before it generates the W_VGU and the W_VGL signals, respectively. The P_VGU and P_VGL signals are digital signals that are generated such that they have a frequency equal to a frequency that the SW voltage sweeps through 0V. The P_VGU and P_VGL signals are generated such that their falling (in one embodiment) edge occurs a pre-selected amount of time prior to the falling (in one embodiment) edge of the W_VGU and W_VGL signals, respectively. The pre-selected amount of time is chosen such that it is greater than a total delay that is expected to occur within the device 200.

The upper buffer 208 is coupled to a control electrode of upper power transistor 231, and the lower buffer 210 is coupled to a control electrode of lower power transistor 232. The upper buffer 208 and the lower buffer 210 output the analog VGU and VGL signals, respectively, that alternately turn on the two power transistors 231 and 232 such that only one power transistor is on at any moment. The VGU signal alternately turns on the upper power transistor 231. The VGL signal alternately turns on the lower power transistor 232. In one embodiment, the VGU and VGL signals have a same power and voltage as have the W_VGU and W_VGL signals, respectively, except that they are delayed in time. In another embodiment, the VGU and VGL signals are delayed in time and may have higher power and/or voltage than the W_VGU and W_VGL signals in order to properly turn on the power transistors 131 and 132.

It is desirable to align, as close as feasible, the turning on of the power transistors 231 and 232 with a moment that the SW voltage sweeps through 0V. Such alignment ensures that the dead time has a minimal duration. See FIG. 7, which shows several cycles of the SW voltage of the device 200. A negative SW voltage exists during the dead time 701. Advantageously, the driver stage 204 aligns, very closely, the turning on of the power transistors 231 and 232 with the moment that the SW voltage sweeps through 0V, thereby minimizing duration of the dead time 701.

The portions of the driver stage 204 shown in FIG. 2 are involved in a proper timing of the turning on, as opposed to the turning off, of the power transistors 231 and 232. The switcher logic 206 also causes the power transistors 231 and 231 to turn off as the CLOCK signal changes its state. However, the turning off of the power transistors 231 and 232 is performed in a straightforward manner because the turning off of the power transistors is a safe action in that there is little danger of both power transistors becoming on at a same time due to improper timing of the turning off action because the VGL signal that turns on the lower power transistor 232 is initiated by a same action within the switcher logic 206 that turns off of the upper power transistor 231, and vice versa.

Figure 3:
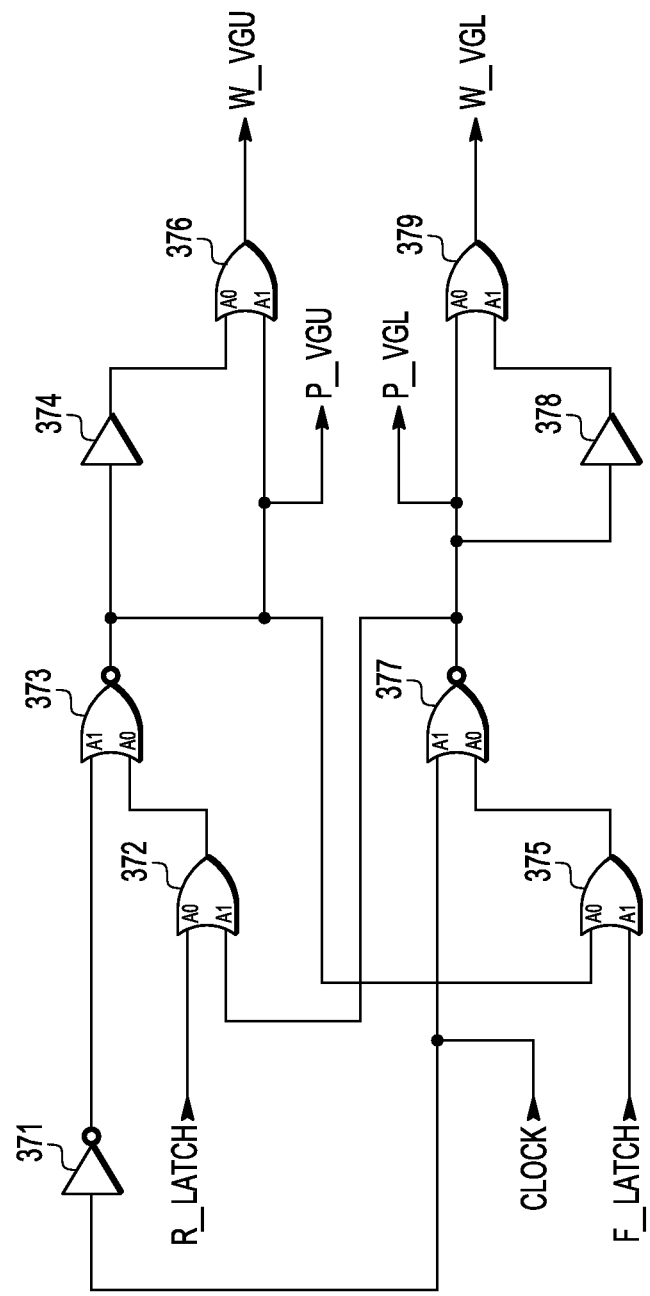
FIG. 3 is a logic diagram of one embodiment of the switcher logic of the driver stage illustrated in FIG. 2.

FIG. 3 is a schematic diagram of one embodiment of the switcher logic 206. The switcher logic 206 comprises an inverter 371 and an OR gate 372, and an output of each inverter is coupled to a NOR gate 373. An output of NOR gate 373 is fed into a delay element 374, an OR gate 375 and into a first input terminal of an OR gate 376. An output of delay element 374 is fed into a second input terminal of OR gate 376. An output of OR gate 375 is fed into a NOR gate 377. An output of NOR gate 377 is fed into a delay element 378, the OR gate 372 and into a first terminal of an OR gate 379. An output of delay element 378 is fed into a second input terminal of OR gate 379. One embodiment of the switcher logic 206 receives the R_LATCH signal, the F_LATCH signal and the CLOCK signal, as illustrated in FIG. 3. The OR gates 376 and 379 in conjunction with the delay elements 374 and 378 allow the switcher logic 206 to generate later falling edges of the W_VGU and W_VGL signals relative to falling edges of the P_VGU and P_VGL signals, respectively. Therefore, transitions of the P_VGU and P_VGL signals occur earlier than transitions of the W_VGU and W_VGL signals, respectively. In one embodiment, delay elements 374 and 378 delay the signal through them by about 10 ns to 40 ns. The switcher logic 206 may include additional gates (not shown) for receiving an ENABLE signal. The one embodiment of the switcher logic 206 outputs the P_VGU signal, the P_VGL signal, the W_VGU signal and the W_VGL signal, as illustrated in FIG. 3.

A purpose of the first delay compensation circuit 221 is to control timing of generation of the VGL signal which turns on the lower power transistor 232 (after the upper power transistor 231 has been turned off). A goal of the first delay compensation circuit 221 is to turn on the lower power transistor 232 as soon as possible after the upper power transistor 231 is turned off. The switcher logic 206 generates the W_VGL signal. As a result of such generation, the buffer 210 outputs the VGL signal. In one embodiment, a high VGL signal turns on the lower power transistor 232. The first delay compensation circuit 221 ensures that a rising edge of the VGL signal occurs at a moment that a falling SW voltage passes through a same voltage level as $V_{REF}$ which is a fixed DC reference voltage. In general, a value of $V_{REF}$ is chosen such that it is between the minimum and maximum values of the SW voltage. In one embodiment, $V_{REF}$ is chosen such that it is as close to 0V as feasible to ensure that the upper power transistor 231 is off when the falling SW voltage reaches $V_{REF}$. In one embodiment, $V_{REF}$ is chosen such that it is above 0V for design convenience. In one embodiment, $V_{REF}$=0.1V. The first delay compensation circuit 221 compensates for delays within the device 200 by outputting the F_LATCH signal at an appropriate moment so as to cause the lower power transistor 232 to turn on at a proper moment. The first delay compensation circuit 221 compensates for such delays in spite of the fact that a duration of the delays is unknown.

A purpose of the second delay compensation circuit 222 is to control timing of generation of the VGU signal which turns on the upper power transistor 231 (after the lower power transistor 232 has been turned off). A goal of the second delay compensation circuit 222 is to turn on the upper power transistor 231 as soon as possible after the lower power transistor 232 was turned off. The switcher logic 206 generates the W_VGU signal. As a result of such generation, the buffer 208 outputs the VGU signal. In one embodiment, a high VGU signal turns on the lower power transistor 232. The second delay compensation circuit 222 ensures that a rising edge of the VGU signal occurs at a moment that a falling SW voltage (occurring immediately before a rising SW voltage) passes through a same voltage level as a $V_{REFR}$ fixed DC reference voltage. See, for example, the falling SW voltage at 39.12 μs in FIG. 7. In general, a value of $V_{REFR}$ is chosen such that it is between a minimum value of the SW voltage and 0V. In one embodiment, the value of $V_{REFR}$ is chosen such that it is as close to 0V as feasible, but still below 0V. In one embodiment, $V_{REFR}$=−0.1V. The second delay compensation circuit 222 compensates for delays within the device 200 by outputting the R_LATCH signal at an appropriate moment so as to cause the upper power transistor 231 to turn on at a proper moment. The second delay compensation circuit 222 compensates for such delays in spite of the fact that the duration of the delays is unknown.

When the upper power transistor 231 is on, the SW voltage is equal to $V_{DD}$ minus a drain-to-source voltage drop of the upper power transistor. Assuming, in one embodiment, $V_{DD}$=3.3V. When the lower power transistor 232 is on, the SW voltage is equal to 3.27V because there is a 30 mV voltage drop in the upper power transistor 231 due its inherent on resistance. The first delay compensation circuit 221 aligns occurrence of the rising edge of the VGL signal with occurrence of a crossing of the constant reference voltage $V_{REF}$ by the variable SW voltage. The falling edge of the VGU signal occurs earlier in each cycle, and it is the falling edge of the VGU signal that turns off the upper power transistor 231 and causes the SW voltage to fall. The falling edge of the VGU signal depends only on the CLOCK signal. As a result of this alignment, the first delay compensation circuit 221 compensates for a total delay within the device 200. In this context, "total delay" means a period between the moment than the SW voltage equals $V_{REF}$ and the moment that power transistor 232 turns on. The total delay includes a delay through the switcher logic 206 (typically, a few hundred of picoseconds), a delay through one of the buffers 208 (typically, tens of nanoseconds), a delay through one of the power transistors 231 (typically, 4 ns to 30 ns), and a delay through the first delay compensation circuit 221 itself (typically, 3 ns to 5 ns). In one embodiment of the device 200, the total delay is typically 20 ns. The first delay compensation circuit 221 accomplishes the compensation in spite of the fact that the SW voltage does not need to be a smooth voltage function or have a monotonic voltage variation. On the other hand, with the known driver stage 104, prior to occurrence of each $SWA=V_{REF}$ event, the SWA voltage must have a monotonic voltage variation for a period equal to at least the total delay in the known device 100.

When the upper power transistor 231 is turned off, the SW voltage falls from $V_{DD}$ minus a drain-to-source voltage drop toward −0.6V. A very short time after the upper power transistor 231 turns off, the lower power transistor 232 turns on, and the SW voltage advantageously does not reach −0.6V. When the lower power transistor 232 is on, the SW voltage becomes −0.03V because the lower power transistor 232, when it is on, has a drop voltage caused by its on resistance. When the lower power transistor 232 is turned off, the SW voltage would begin to fall from −0.03V toward −0.6V.

Both the first delay compensation circuit 221 and the second delay compensation circuit 222 receive the SW voltage as one of their inputs. The first compensation circuit 221 receives the P_VGU signal, the VGL signal, and the $V_{REF}$ voltage as additional inputs. The second compensation circuit 222 receives the P_VGL signal instead of the P_VGU signal, the VGU signal instead of the VGL signal, and the $V_{REFR}$ voltage instead of the $V_{REF}$ voltage as additional inputs. The first compensation circuit 221 outputs the F_LATCH signal. The second compensation circuit 222 outputs the R_LATCH signal instead of the F_LATCH signal. In other respects, the first delay compensation circuit 221 operates in essentially a same fashion as the second delay compensation circuit 222. Because the first delay compensation circuit 221 operates in essentially the same fashion as the second delay compensation circuit 222, only the operation of the first delay compensation circuit (hereinafter "compensation circuit") 221 will be described in detail.

The compensation circuit 221 accomplishes edge alignment control. The phrase "edge alignment control" means that the compensation circuit 221 aligns a rising edge of the VGL signal with a moment that $SW=V_{REF}$ during a falling SW voltage, i.e., during a downward sweep of the SW voltage.

Figure 4:
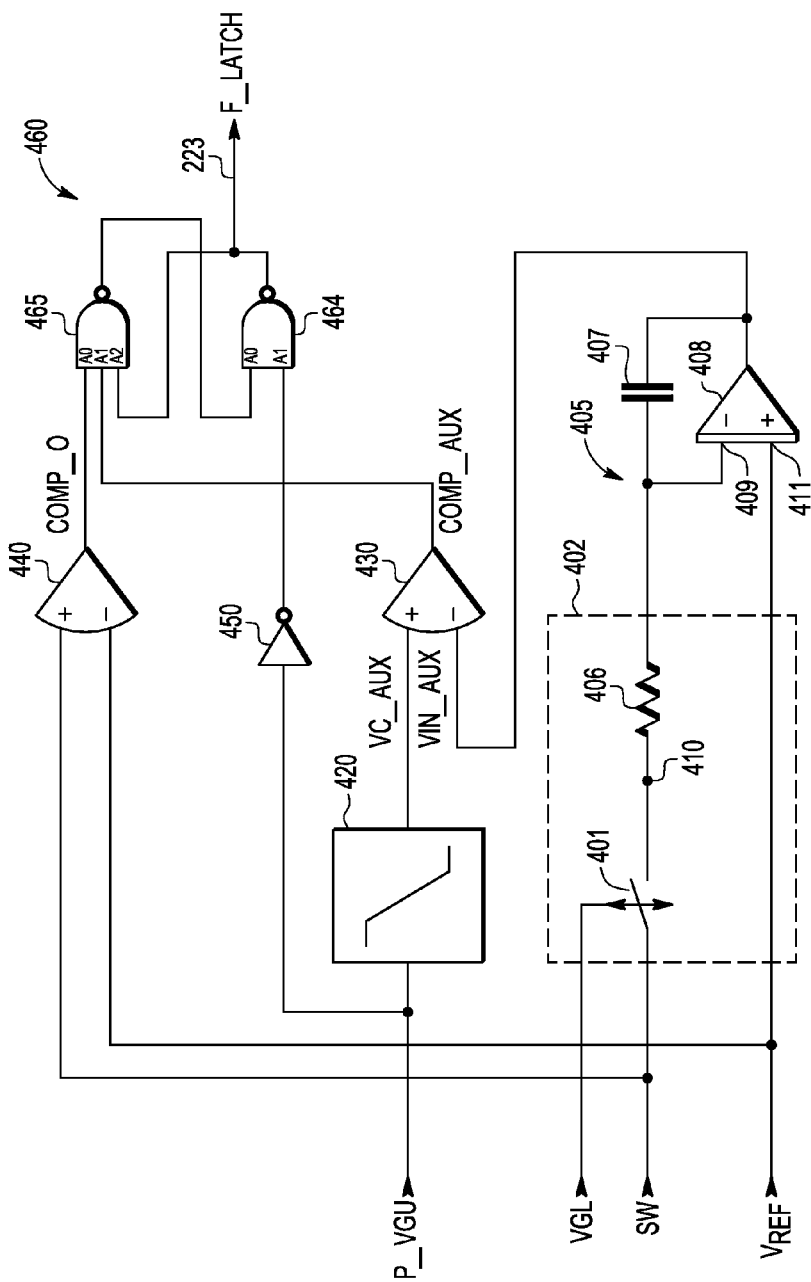
FIG. 4 is a schematic and block diagram of one embodiment of the delay compensation circuit of the driver stage illustrated in FIG. 2, which includes a sampler circuit and a series resistance.

FIG. 4 is a schematic and block diagram of one embodiment of the compensation circuit 221. The compensation circuit 221 includes a sampler circuit 401 that samples and holds the SW voltage at each occurrence of a beginning of a zero-to-$V_{DD}$ voltage transition of the VGL signal. In the illustrated embodiment, the sampler circuit 401 is sensitive to the rising edge of the VGL signal, such that, when the rising edge of the VGL signal occurs, a value of the SW voltage at that moment is copied to a node 410. In another embodiment (not shown) of the compensation circuit 221, a falling edge of the SW voltage is aligned with a falling edge of the VGL signal at the moment that $SW=V_{REF}$ and, in such embodiment, a different sampler circuit is implemented. The compensation circuit 221, in the illustrated embodiment, aligns the SW voltage with a rising edge of the VGL signal at the moment that the variable voltage SW equals the constant reference voltage $V_{REF}$.

The compensation circuit 221 includes an integrator 405. In the illustrated embodiment, the integrator 405 comprises a resistor 406, a capacitor 407 and an operational amplifier 408. An input node 411 of the amplifier 408 receives the $V_{REF}$ signal, and an inverted input node 409 of the amplifier is connected to capacitor 407 and resistor 406 to perform the integration. The integrator 405 integrates a voltage difference between the SW voltage and $V_{REF}$. A time constant of the integrator 405 is chosen to be much larger than a period of the SW voltage waveform. In one embodiment, the time constant is at least forty (40) times greater than the period of the SW voltage waveform. An output of the integrator 405 is a VIN_AUX signal. Initially, the SW voltage at node 410 is lower than the voltage $V_{REF}$ at the input node 411 of the amplifier, and the output voltage VIN_AUX of the integrator increases with each sampling event because the integrator has an inversion characteristic. A rate of increase of VIN_AUX depends on values of the resistor 406 and capacitor 407 of the integrator 405. In accordance with the invention, the rate of increase is chosen to be much slower than a frequency of the SW voltage waveform. In one embodiment, the rate of increase is chosen to be 15 mV/μs.

The compensation circuit 221 includes a waveform generator 420. The P_VGU signal is fed into an input terminal of the waveform generator 420. A falling (in one embodiment) edge of the P_VGU signal triggers generation of the VC_AUX waveform. The waveform generator 420 generates a VC_AUX waveform which is a smooth and monotonically decreasing voltage. In one embodiment, the VC_AUX waveform decreases from 1.2V to 0.2V in 84 ns. The waveform generator 420 generates the VC_AUX waveform at start-up of the driver stage 204. The waveform generator 420 also generates the VC_AUX waveform at the beginning of every cycle of the SW voltage.

The compensation circuit 221 includes a comparator 430 that has one input terminal for receiving the VC_AUX signal, an inverted input terminal for receiving the VIN_AUX signal, and an output terminal for outputting a COMP_AUX signal.

The compensation circuit 221 also includes a comparator 440 that has one input terminal for receiving the SW voltage, an inverted input terminal for receiving the $V_{REF}$ signal, and an output terminal for outputting a COMP_0 signal. Comparator 440 is used during initialization and during a forced fall back.

The compensation circuit 221 also includes an inverter 450 that receives the P_VGU signal and that outputs a P_VGU_B signal.

The compensation circuit 221 further includes an RS (re-set-set) latch 460 having input terminals for receiving the COMP_0 signal, the COMP_AUX signal and the P_VGU_B signal, and an output terminal for outputting an F_LATCH signal. The RS latch 460 includes a three-input NAND gate 465 and a two-input NAND gate 464 configured as illustrated in FIG. 4. The F_LATCH signal outputted by the RS latch 460 becomes the signal outputted by the compensation circuit 221.

A threshold voltage of comparator 430 is generated by the VIN_AUX signal, which is an error function. The VIN_AUX signal is generated by integrator 405 from a difference between the reference voltage $V_{REF}$ and the variable voltage SW that is sampled at a moment that the VGL signal, which is a feedback signal, changes state. The compensation circuit 221 produces a steady state F_LATCH signal, which is also a feedback signal. These feedback signals, and other signals in the device 200, encounter delays. To reduce dead time, the compensation circuit 221 compensates for such delays.

The operation of the compensation circuit 221 can be better understood by first analyzing it when it is in an initial state, next analyzing it when it is in a middle state, and then analyzing it when it is in a synchronized state. The operation of the compensation circuit 221 can also be appreciated by referring to FIG. 5. In the following explanation of the operation of compensation circuit 221, it is assumed that the SW voltage is sweeping downwardly.

Initial state. By "initial state" it is meant the state of the compensation circuit 221 in a first cycle of the SW voltage waveform. In the initial state, a VC_AUX=VIN_AUX event 509 occurs after the SW=$V_{REF}$ event.

To understand the operation of the compensation circuit 221, assume that a voltage of output VIN_AUX of the integrator 405 is initially very low. Assume also that a falling edge of the P_VGU signal is generated by the switcher logic 206 a certain amount of time prior to occurrence of the falling edge of the SW voltage. As explained more fully below, the compensation circuit 221 uses the P_VGU signal to help compensate for the total delay that occurs within the device 200.

The COMP_AUX output of the comparator 430 goes low when VC_AUX equals VIN_AUX. The voltage VIN_AUX is very low during the initial state. The VC_AUX signal starts high, and, although it immediately starts to drop, it remains higher than VIN_AUX during the initial state. As a result, the COMP_AUX output of the comparator 430 starts high at start-up of the compensation circuit 221 and goes low long after occurrence of the falling edge of the P_VGU signal.

The F_LATCH signal at an output node 223 of the compensation circuit 221 is initially controlled by the COMP_0 signal outputted by the comparator 440. For each cycle of the SW voltage waveform before occurrence of the falling edge of P_VGU, the COMP_0 signal is high because the SW voltage is higher than $V_{REF}$. A set state of the RS latch 460 occurs when an A1 input of gate 464 goes low, which occurs when P_VGU signal is high, such as before occurrence of the falling edge of P_VGU. A high P_VGU signal is sufficient to define the set state of the RS latch 460 because, when either input of gate 464 goes low, the output of gate 464 goes high. Therefore, at the beginning of each cycle, the F_LATCH signal at the output node 223 of the compensation circuit 221 is high.

Sometime after startup (during a first cycle), but while the compensation circuit 221 is still in the initial state, a low COMP_0 signal occurs before a low COMP_AUX signal. For this reason, the state of the F_LATCH signal at the output node 223 of the compensation circuit 221 is initially controlled by a COMP_0 signal of comparator 440 (see COMP_0 to F_LATCH arrow in FIG. 5, Initial State). The low COMP_0 signal causes the output of gate 465 to go high. The high signal outputted by gate 465 is fed into the A0 input of gate 464. A high P_VGU_B signal is fed into the A1 input of gate 464 (the P_VGU signal is low, and the inverter 450 causes the P_VGU_B signal to be high). As a result, the output of gate 464 and the output of RS latch 460 go low. Therefore, the low COMP_0 signal resets the RS latch 460, which means that the F_LATCH signal outputted by the compensation circuit 221 goes low. Once the low COMP_0 signal resets the RS latch 460, a high COMP_0 signal will not remove the RS latch from the reset state because the output of the RS latch is latched in the low state.

To remove the RS latch 460 from the reset state, i.e., to place the RS latch in a set state, a low P_VGU_B signal is fed into the A1 input of gate 464. This occurs when the P_VGU signal is high, and the inverter 450 causes the P_VGU_B signal to be low. The set state of the RS latch 460 results in the F_LATCH signal at the output node 223 of the compensation circuit 221 being high. Therefore, a high P_VGU signal releases the RS latch 460 so that it, and the compensation circuit 221, can accept another sample of the SW voltage.

Figure 5:
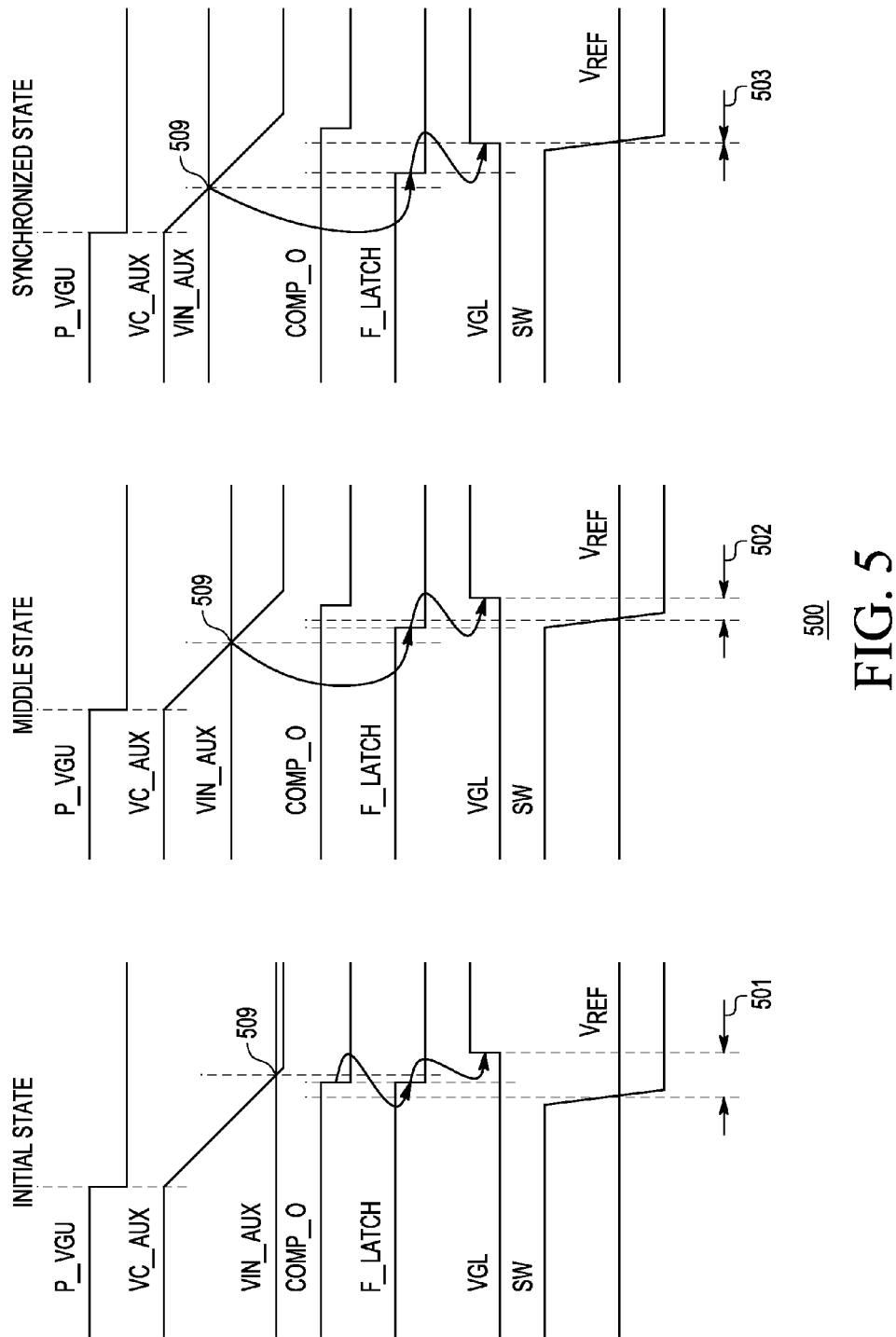
FIG. 5 is a graph of exemplary signals that may be present in the device illustrated in FIG. 2, in accordance with one embodiment of the invention.

Comparator 440 compares the SW voltage and the $V_{REF}$ voltage. Comparator 440 sets a maximum time interval between occurrence of the SW=$V_{REF}$ event (at such moment, upper power transistor 231 has already been turned off) and occurrence of the rising edge of the VGL signal (which causes lower power transistor 232 to turn on). Comparator 440 ensures that the maximum time interval between the SW=$V_{REF}$ event and occurrence of the rising edge of the VGL signal is equal to a delay within comparator 440 plus a delay within the switcher logic 206 plus a delay within the SMPS 202. However, it is desirable that the time interval between the SW=$V_{REF}$ event (when upper power transistor 231 is already off) and the rising edge of the VGL signal (when lower power transistor 232 turns on) be less than the delay within comparator 440 plus the delay within the switcher logic 206 plus the delay within the SMPS 202. Therefore, other portions of the compensation circuit 221 advantageously allow the time interval between the SW=$V_{REF}$ event and the rising edge of the VGL signal to be much shorter than the maximum delay ensured by comparator 440. FIG. 5 illustrates that, in the initial state, the time interval has a first duration 501.

The VGL signal is triggered by the F_LATCH signal. In one embodiment, a rising edge of the VGL signal is triggered by a low F_LATCH signal after a delay in the switcher logic 206. When the rising edge of the VGL signal occurs (see F_LATCH to VGL arrow in FIG. 5, Initial State), the sampler circuit 401 samples the SW voltage. Because sampling occurs after the SW=$V_{REF}$ event, when the compensation circuit 221 is in the initial state, the sampled SW voltage at node 410 is below $V_{REF}$. The sampled SW voltage at node 410 pulls down current from inverted input node 409 of the amplifier 408 of the integrator 405. As a result, the VIN_AUX voltage starts to rise a little at each cycle.

Middle state. During a middle state, the falling edge of the P_VGU signal starts the VC_AUX waveform, and the VIN_AUX voltage is now higher than it was during the initial state. During the middle state, the VIN_AUX voltage is at such a voltage level that the VC_AUX=VIN_AUX event 509 occurs before the SW=$V_{REF}$ event. Therefore, the A1 input of gate 465 goes low before the A0 input of the gate 465 goes low. Consequently, comparator 430 (and not comparator 440) controls the F_LATCH signal that is outputted by the compensation circuit 221 (see VIN_AUX/VC_AUX to F_LATCH arrow in FIG. 5, Middle State).

During the middle state, the rising edge of the VGL signal causes the sampler circuit 401 to sample the SW voltage which, at such sampling moment (see F_LATCH to VGL arrow in FIG. 5, Middle State), has a value that is lower than the $V_{REF}$ voltage, and, as a result, the output voltage (VIN_AUX) of the integrator 405 continues to increase.

The time interval from the SW=$V_{REF}$ event to the occurrence of the rising edge of the VGL signal advantageously reduces (compared to the initial state) as comparator 430 starts to control the F_LATCH signal at the output node 223 of the compensation circuit 221. The time interval from the SW=$V_{REF}$ event to the occurrence of the rising edge of the VGL signal continues, advantageously, to reduce during successive samples of the SW voltage while the compensation circuit 221 is in the middle state. The switcher logic 206 generates a rising edge of the VGL signal based upon the F_LATCH signal. For each cycle of the SW voltage, the moment that the rising edge of the VGL occurs approaches a little closer in time to the SW=$V_{REF}$ event for the reason that the falling edge of the F_LATCH signal continues to occur earlier relative to the SW=$V_{REF}$ event. The falling edge of the F_LATCH signal continues to advance in time for the reason that the VC_AUX=VIN_AUX event 509 continues to advance with each cycle of the SW voltage. The VC_AUX=VIN_AUX event 509 continues to advance in time for the reason that the output VIN_AUX of the integrator 405 continues to increase with each cycle of the SW voltage. FIG. 5 illustrates that, in the middle state, the time interval has a second duration 502 that is shorter than the first duration 501.

Synchronized state. After several cycles (in one embodiment, after 80 cycles when a frequency of the SW voltage waveform is 8 MHz), the compensation circuit 221 enters a synchronized state. The synchronized state is defined when a sufficient number of cycles have occurred such that the rising edge of the VGL signal occurs at the same moment that the SW voltage equals $V_{REF}$. During the synchronized state, the falling edge of the P_VGU signal starts the VC_AUX waveform. When VC_AUX=VIN_AUX, the comparator 430 is triggered, which generates very shortly thereafter, a falling edge of the F_LATCH signal at the output node 223 of the compensation circuit 221 (see VIN_AUX/VC_AUX to F_LATCH arrow in FIG. 5, Synchronized State).

During the synchronized state, the rising edge of the VGL signal occurs at about the same moment that the SW voltage equals $V_{REF}$. FIG. 5 illustrates that, in the synchronized state, the time interval has a third duration 503 that is advantageously very short and shorter than the second duration 502. The rising edge of the VGL signal is triggered by the F_LATCH signal (see F_LATCH to VGL arrow in FIG. 5, Synchronized State). The rising edge of the VGL signal causes the sampler circuit 401 to sample the SW voltage. During the synchronized state, the SW voltage is falling through $V_{REF}$. Therefore, during the synchronized state, a value of the sampled SW voltage is equal to $V_{REF}$. Consequently, during the synchronized state, the input voltage of the integrator 405 becomes equal to $V_{REF}$. Now, because both inputs of the integrator 405 are equal to the $V_{REF}$ voltage, the voltage (VIN_AUX) of the output of the integrator does not change, and a steady state is reached. During the synchronized state, the F_LATCH signal outputted by the compensation circuit 221 occurs, in one embodiment, 13 ns before occurrence of the SW=$V_{REF}$ event. As a result, the driver stage 204 advantageously reduces the dead time, i.e., the interval of time when neither power transistor 231 and 232 is on, to only about ten to a few hundred picoseconds, in one embodiment. With the known driver stage 104, the dead time is disadvantageously much longer, e.g., about 10 ns to 40 ns.

The aforesaid explanation of the operation of the driver stage 204 assumes that the delay from the P_VGL and P_VGU signals to the SW voltage sweep, and the delay from the F_LATCH and R_LATCH signals to the VGL and VGU signals, respectively, do not change. In an actual implementation of the device 200, any occasional changes in these delays cause the compensation circuit 221 to reach a new steady state to compensate for the new values of the delays.

The driver stage 204 is designed such that the amount of time that the P_VGU signal occurs prior to occurrence of the SW=$V_{REF}$ event is at least 3 ns to 5 ns greater than the total delay for which the compensation circuit 221 compensates. This is because the compensation circuit 221 outputs the F_LATCH signal 3 ns to 5 ns after, and in response to, occurrence of the falling edge of the P_VGU signal.

The driver stage 204 advantageously can be used when the power transistors 231 and 232 may be replaced by other power transistors that have different characteristics, and/or when their delays are unknown and/or vary much, because any delay is compensated for by the TLL of the driver stage 204. In this way, fast or slow power transistors 231 and 232 can be used because, after a steady state is reached, all the delays are compensated. A designer just need to know what should be a maximum expected delay so that the P_VGU signal and the P_VGL signal can be generated enough time in advance of the SW=$V_{REF}$ event and the SW=$V_{REFR}$ event, respectively, to compensate for a worst case delay.

Figure 1:
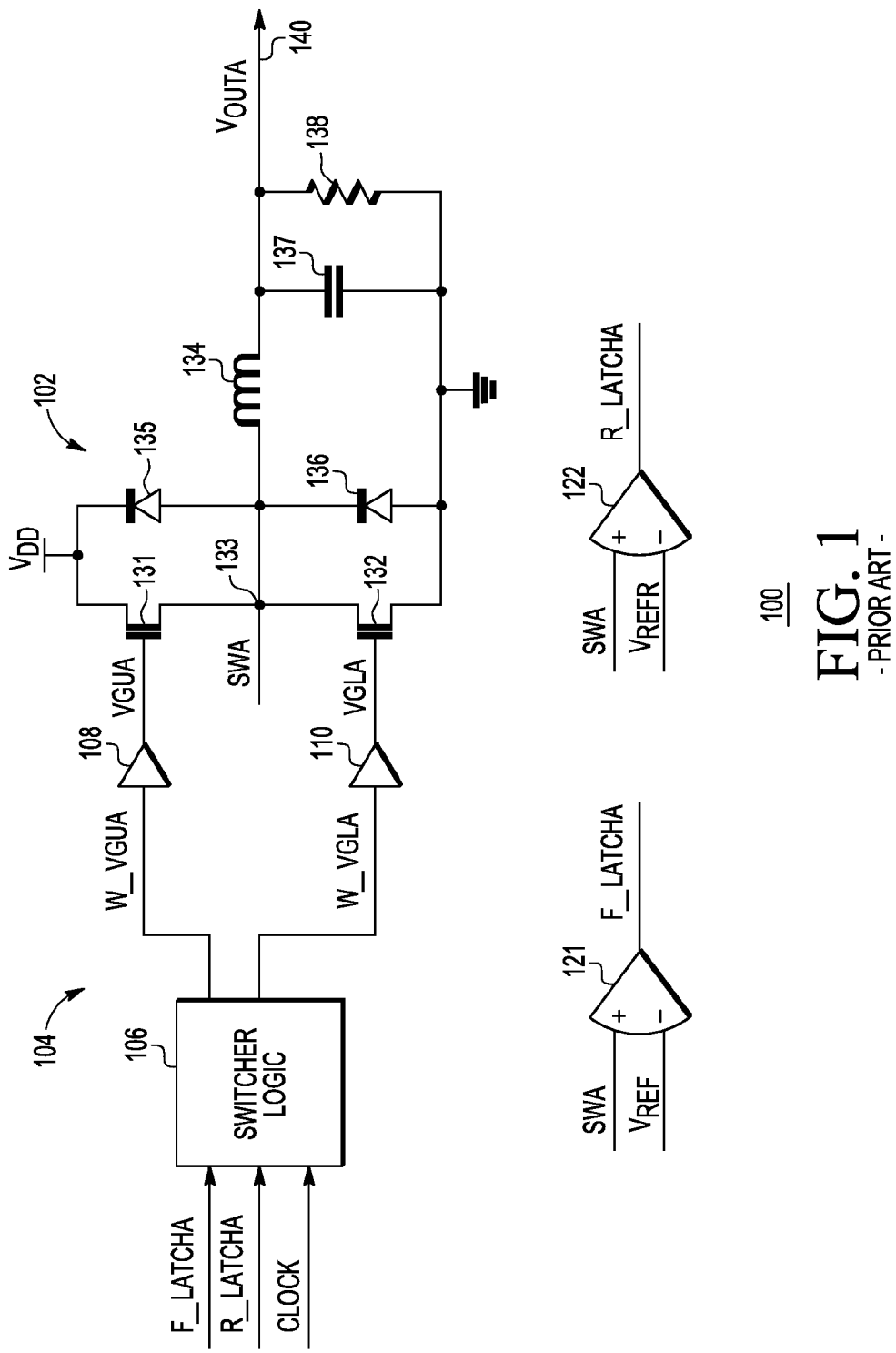
FIG. 1 is a simplified functional block diagram of a known device including an output stage of a switched-mode power supply and a known driver stage therefor.
Figure 6:
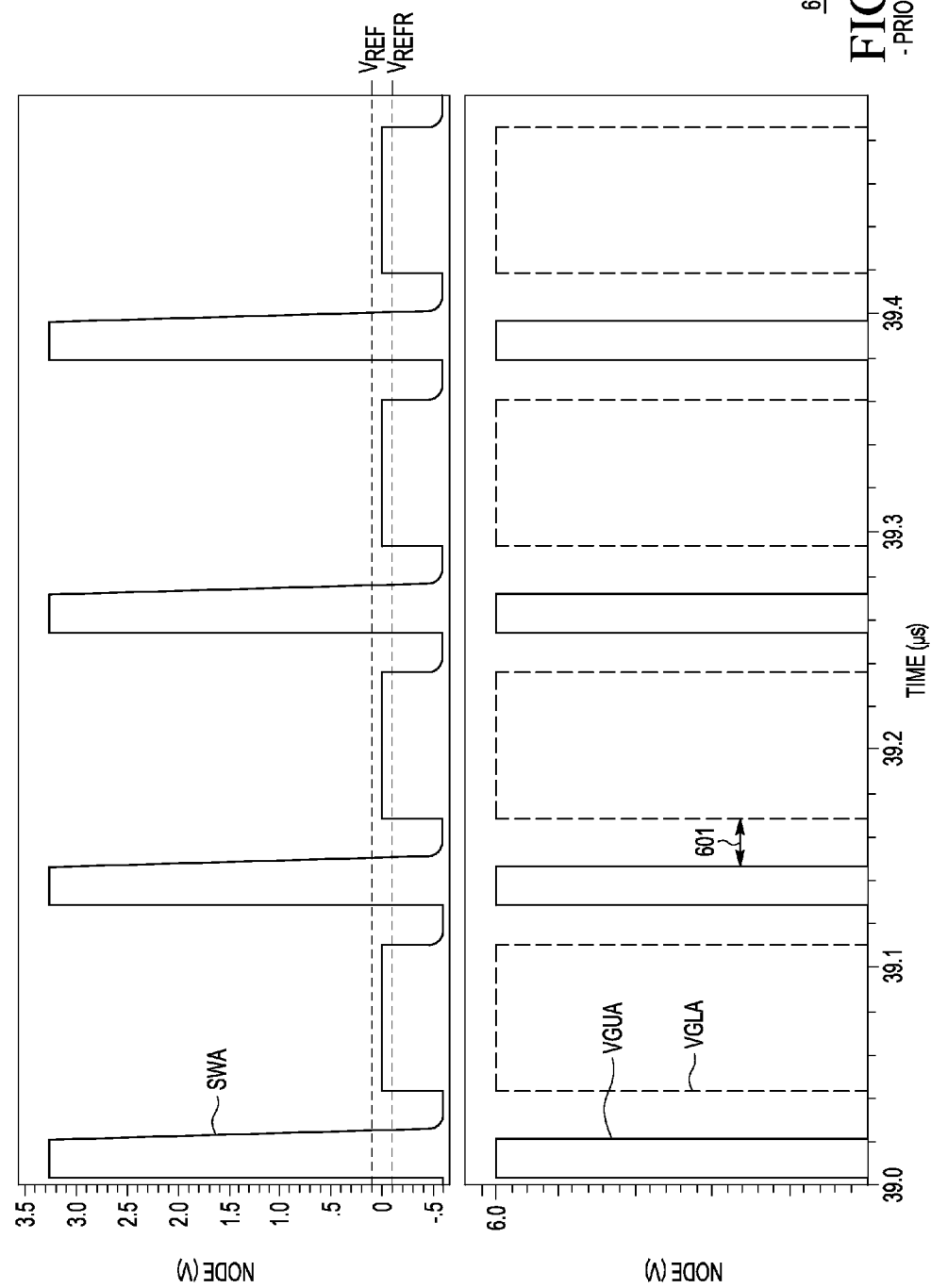
FIG. 6 is a pair of graphs illustrating results of operation of a simulation of the known device illustrated in FIG. 1.

FIG. 6 illustrates graphs 600 of results of operation of a simulation of the known device 100. The vertical axis of the top graph represents the voltage SWA at node 133 of FIG. 1. The vertical axis of the bottom graph represents the voltage VGUA at the control electrode of upper power transistor 131, and the voltage VGLA at the control electrode of lower power transistor 132 of FIG. 1. The horizontal axis represents a typical 500 ns interval of time. FIG. 6 illustrates that a dead time 601 of a long duration exists between the moment than the VGUA signal goes low (upper power transistor 131 turns off) and the moment that the VGLA signal goes high (lower power transistor 132 turns on), and vice versa. FIG. 6 illustrates that the dead time 601 is approximately 0.02 μs=20 ns. FIG. 6 also illustrates that the SWA voltage disadvantageously goes down to −0.6V during each dead time. The SWA voltage going down to −0.6V during each dead time detrimentally effects efficiency of the known SMPS 102. There are two factors have a detrimental effect on the efficiency of the known SMPS 102: 1) the SWA voltage going down to −0.6V during each dead time, and 2) a long duration dead time of 20 ns. Both factors, when combined, generate an energy loss $E_{Loss}$=0.6V×$I_{R138}$×20 ns, where $I_{R138}$ is current through output resistor 138.

Figure 7:
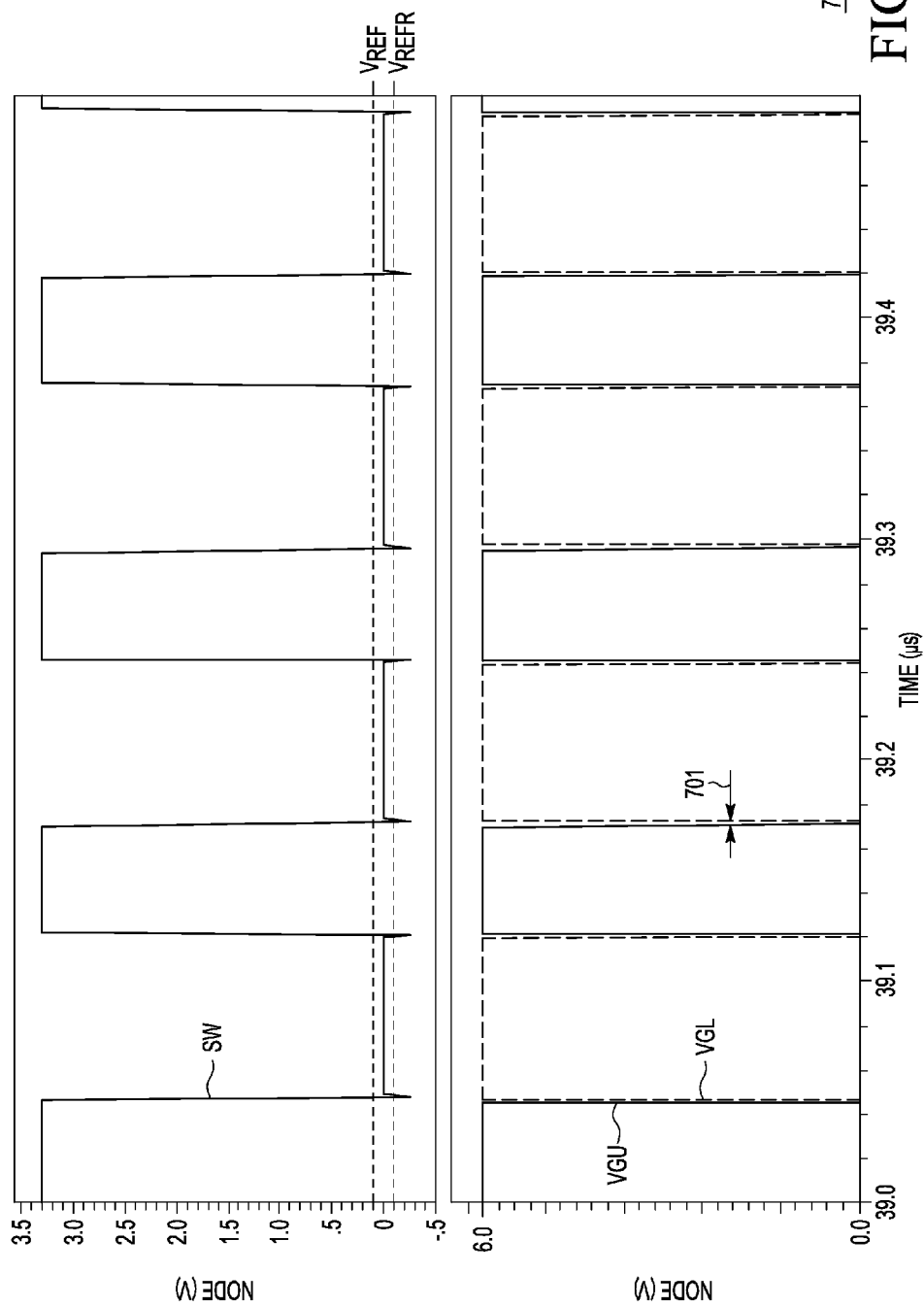
FIG. 7 is a pair of graphs illustrating results of operation of a simulation of the device illustrated in FIG. 2, in accordance with one embodiment of the invention.

FIG. 7 illustrates graphs 700 of results of operation of a simulation of one embodiment of the device 200 in accordance with the invention. The vertical axis of the top graph represents the voltage SW at node 233 of FIG. 2. The vertical axis of the bottom graph represents the voltage VGU at the control electrode of upper power transistor 231, and the voltage VGL at the control electrode of lower power transistor 232 of FIG. 2. The horizontal axis represents a typical 500 ns interval of time after the compensation circuit 221 has reached the synchronized state. FIG. 7 illustrates that a dead time 701 of a very short duration exists between each moment than the VGU signal goes low (upper power transistor 231 turns off) and each moment that the VGL signal goes high (lower power transistor 232 turns on), and vice versa. FIG. 7 illustrates that the dead time 701 is advantageously only approximately 0.1 ns=100 ρs. FIG. 7 also illustrates that the SW voltage advantageously does not go down to −0.6V during each dead time. The SW voltage does not go down to −0.6V during each dead time because the VGL signal, which turns on the lower power transistor 132, occurs when the SW voltages reaches $V_{REFR}$, which, in the simulation shown in FIG. 7, is −0.1V. As a result, the lower power transistor 132 turns on before the SW voltage has an opportunity to go down to −0.6V. The lower power transistor 132, while it is on, prevents the SW voltage from going below −0.03V. In the simulation results shown FIG. 7, the SW voltage advantageously does not go below −0.2V.

Figure 8:
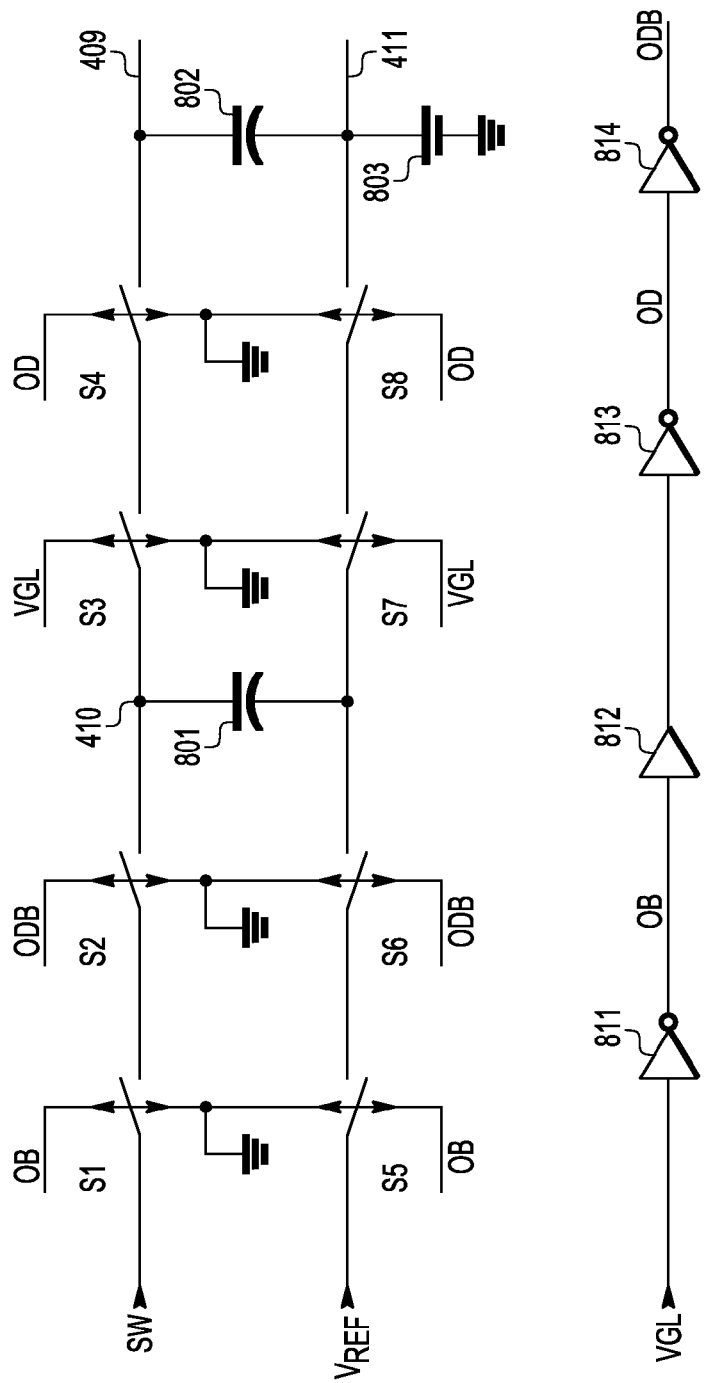
FIG. 8 is a schematic diagram of one embodiment of a circuit that emulates the sampler circuit and the series resistance of the delay compensation circuit illustrated in FIG. 4.

FIG. 8 is a schematic diagram of one embodiment of circuit 402. The embodiment of circuit 402 shown in FIG. 8 emulates the sampler circuit 401 and the resistor 406 shown in FIG. 4. The embodiment of circuit 402 shown in FIG. 8 comprises eight (8) switches S1 to S8, and capacitors 801 and 802, which are configured as illustrated in FIG. 8. Capacitor 802 is coupled between nodes 409 and 411. The embodiment of circuit 402 shown in FIG. 8 also comprises a DC voltage source 803 that is coupled between node 411 and a ground terminal. In one embodiment, such DC voltage is 1.0V. The embodiment of circuit 402 shown in FIG. 8 also comprises inverter 811 that receives the VGL signal and produces an OB signal. Inverter 811 is coupled to a delay cell 812 that is coupled to an inverter 813 that produces an OD signal. Inverter 813 is coupled to an inverter 814 that produces an ODB signal. For each switch, S1 to S8, when the V>0, the switch is turned on, i.e., closed, and when V=0, the switch is turned off, i.e., open, where V is a voltage controlling the switch. The embodiment of circuit 402 shown in FIG. 8 continually sequences through the following five passes. Each pass is defined by the VGL signal and the delay of delay cell 812. The VGL signal is controlled indirectly by the CLOCK signal.

Pass (1). When the VGL signal is low, the OD signal is low, and the OB and ODB signals are high. In this way, the switches S1, S5, S2 and S6 are on, and the switches S3, S7, S4 and S8 are off. The capacitor 801 is connected through switches between SW and $V_{REF}$, and the voltage of this capacitor follows the waveform given by SW–$V_{REF}$. This pass is defined by a low state of the VGL signal.

Pass (2). At the rising edge of the VGL signal, the following switching occurs. VGL goes high and the OB signal goes low. This turns on switches S3 and S7, and turns off switches S1 and S5. Now, capacitor 801 is floating. The circuit of FIG. 8 stays in this pass while the delay cell 812 maintains the low state.

Pass (3). After a delay of a few nanoseconds inserted by the delay cell 812, the OD signal goes high and the ODB signal goes low. This turns on switches S4 and S8, and turns off switches S2 and S6. Now, capacitor 801 is in parallel with capacitor 802, and a charge of capacitor 801 is transferred to nodes 409 and 411. This pass is defined by a high state of the VGL signal.

Pass (4). At the falling edge of the VGL signal, the following switching occurs. When the VGL signal goes low, the OB signal goes high. This means that switches S3 and S4 are turned off, and switches S1 and S5 are turned on. Now, capacitor 801 is floating. The circuit of FIG. 8 stays in this pass while the delay cell 812 maintains the high state.

Pass (5). After a delay of a few nanoseconds inserted by the delay cell 812, the OD signal goes low and the ODB signal goes high. This turns off switches S4 and S8, and turns on switches S2 and S6. Now, capacitor 801 is connected between the SW and $V_{REF}$ nodes, and capacitor 801 follows the waveform given by SW–$V_{REF}$. This state is the same as in pass (1), and the sequence is complete. The sequence from pass (1) to pass (4) is controlled by the VGL signal.

For each pass, capacitor 801 follows the SW–$V_{REF}$ voltage, and, at the rising edge of the VGL signal, disconnects from the SW and $V_{REF}$ nodes, and connects to nodes 409 and 411. When the rising edge of the VGL signal occurs, capacitor 801 is charged with a value of the SW–$V_{REF}$ voltage that exists at the moment of the rising edge of the VGL signal.

Because capacitor 801 is switching with a frequency "f", the charge rate that this switching introduces into the inverted input node 409 of amplifier 408 is equivalent to a current generated by resistor 406. The resistance of resistor 406 is equal to $(C_{801} f)^{-1}$, where $C_{801}$ is capacitance of capacitor 801. The ideal sampler 401 is added because the sampled SW voltage is controlled by the VGL signal.

In FIG. 4, $V_{REF}$ is shown connected directly to the input node 411 of amplifier 408. On the other hand, in FIG. 8, $V_{REF}$ is not connected directly to the input node 411 of the amplifier 408. This is possible because both nodes of capacitor 801 are switched, thereby preserving the charge of capacitor 801, and the integrator 405 works as if $V_{REF}$ were connected to the non-inverted node of the amplifier 408. In FIG. 8, the input node 411 of amplifier 408 is coupled to the DC voltage source 803. The embodiment of circuit 402 illustrated in FIG. 8 is advantageous because the amplifier 408 can work with a more convenient bias voltage than the $V_{REF}$ voltage. The $V_{REF}$ and $V_{REFR}$ voltages (+0.1V and –0.1V, respectively) used in one embodiment of the driver stage 204 are voltages that are difficult to use within an integrated circuit (because they are very close to 0V). If an integrated circuit is supplied by 3.3V and 0V, such as in the embodiment of circuit 402 shown in FIG. 8, the more convenient bias voltage with which to work is in a range of 0.8V to 2.5V (note that 2.5V=3.3V–0.8V). By using the embodiment of circuit 402 shown in FIG. 8, the aforesaid difficulty with bias voltages can be avoided, and the compensation circuit 221 can consume less power and occupy less area.

In one embodiment, an integrated circuit includes the driver stage 204 for the circuit 202. The circuit 202 is an external circuit located outside of, and external to, the integrated circuit. The external circuit includes the two sub-circuits 231 and 232. The driver stage 204 includes the switcher logic 206 that produces signals (W_VGU and W_VGL) that control switching on and off of the two sub-circuits 231 and 232. The switcher logic 206 also produces other signals (P_VGU and P_VGL) in advance of the signals (W_VGU and W_VGL) that control the switching of the two sub-circuits 231 and 232. The driver stage 204 includes the delay compensations circuits 221 and 222, which are coupled to the switcher logic and to the external circuit, and which produce timing signals (F_LATCH and R_LATCH) for the switcher logic 206. The timing signals (F_LATCH and R_LATCH) are closely aligned with moments that a changing voltage at the node 233 between the sub-circuits passes through threshold voltages. The timing signals (F_LATCH and R_LATCH) compensate for all delays of signals through the integrated circuit and the external circuit such that a period that both sub-circuits 231 and 232 is off is minimized, while ensuring that both sub-circuits are not on at a same time.

In another embodiment, an integrated circuit includes the delay compensation circuits 221 and 222, each of which further includes a terminal for receiving a varying signal (the varying voltage SW) from the circuit 202. The circuit 202 is an external circuit located outside of, and external to, the integrated circuit. The sampler circuit 401 samples and holds a present value of the varying signal at each occurrence of a transition in the digital signal (VGL). The integrator 405, which is coupled to the sampler circuit, integrates a voltage difference between a sample of the varying signal and the reference signal ($V_{REF}$), and outputs results (VIN_AUX) of the integration. A time constant of the integrator 405 is greater than a period of the varying signal. The waveform generator 420 generates the decreasing voltage (VC_AUX) in response to a transition in the second digital signal (P_VGU). The comparator 430, which has one input terminal for receiving the decreasing voltage (VC_AUX), an inverted input terminal for receiving the results (VIN_AUX) and an output terminal for outputting the signal (COMP_AUX), generates the output signal (F_LATCH).

The driver stage 204 is not limited for use with a SMPS; the driver stage can be used with other circuits that have elements that are switched on and off. For example, the driver stage 204 can be used with an H-bridge.

The device 200 is not limited to comprising the SMPS 202, and may instead comprise any circuit that includes two sub-circuits each of which has a provision for being switched on and off. The upper power transistor 231 is not limited to being a single transistor and may instead be a sub-circuit that has a provision for being switched on and off. The lower power transistor 232 is not limited to being a single transistor and may instead be another sub-circuit that has a provision for being switched on and off.

Although, in one embodiment, the switcher logic 206, the first delay compensation circuit 221 and the second delay compensation circuit 222 are disposed on an integrated circuit fabricated using CMOS technology, these circuits can also be disposed on an integrated circuit fabricated using other technologies. Although the invention has been described with respect to specific conductivity types or polarity of potentials, skilled artisans appreciated that conductivity types and polarities of potentials may be reversed.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe.

Thus, these terms are not necessarily intended to indicate temporal or other prioritization of such elements. Note that the term "couple" has been used to denote that one or more additional elements may be interposed between two elements that are coupled.

Although the invention is described herein with reference to specific embodiments, various modifications and changes can be made without departing from the scope of the present invention as set forth in the claims below.

What is claimed is:

1. An integrated circuit, comprising:
a delay compensation circuit, disposed on a circuit-supporting substrate, including:
a terminal for receiving a varying signal,
a sampler circuit that samples and holds a present value of the varying signal at each occurrence of a transition in a digital signal,
an integrator, coupled to the sampler circuit, that integrates a voltage difference between a sample of the varying signal and a reference signal, and outputs results of the integration, wherein a time constant of the integrator is greater than a period of the varying signal,
a waveform generator that generates a decreasing voltage in response to a transition in a second digital signal, and
a comparator that has one input terminal for receiving the decreasing voltage, an inverted input terminal for receiving the results, and an output terminal for outputting a signal that generates an output signal.

2. The integrated circuit of claim 1, wherein a changed state of the output signal is aligned with a moment that an amplitude of the varying signal equals the reference signal.

3. An integrated circuit, comprising:
switcher logic for producing a first signal and a second signal for controlling a circuit external to the integrated circuit, and
a delay compensation circuit, coupled to the switcher logic, the delay compensation circuit including:
a sampler circuit that samples and holds a present value of a varying signal at each occurrence of a transition in the first signal, the varying signal received from the external circuit,
an integrator, coupled to the sampler circuit, that integrates a voltage difference between a sample of the varying signal and a reference level and that outputs results of integration, wherein a time constant of the integrator is greater than a period of the varying signal,
a waveform generator that generates a decreasing voltage in response to a transition in a digital signal from the switcher logic, and
a comparator that has one input terminal for receiving the decreasing voltage, an inverted input terminal for receiving the results of integration, and an output terminal for outputting a signal that generates a triggering signal,
wherein a changed state of the triggering signal is aligned with a moment that an amplitude of the varying signal equals the reference level,
wherein the switcher logic produces, in response to the changed state of the triggering signal, the first signal.

4. The integrated circuit of claim 3, including:
a second delay compensation circuit coupled to the switcher logic for generating a second triggering signal for the switcher logic, wherein a changed state of the second triggering signal is aligned with a moment that an amplitude of the varying signal equals a second reference level, and
wherein the switcher logic produces, in response to the changed state of the second triggering signal, the second signal.

5. The integrated circuit of claim 4, wherein the external circuit includes a first sub-circuit and a second sub-circuit, each of which having a provision for being switched on and off, wherein the external circuit produces the varying signal whose amplitude varies in response to the first sub-circuit and the second sub-circuit being switched on and off.

6. The integrated circuit of claim 5, wherein the switcher logic, when coupled to the external circuit, controls the external circuit such that only one of the first sub-circuit and the second sub-circuit is on at any given instant of time.

7. The integrated circuit of claim 5, wherein the external circuit is an output stage of a switched-mode power supply, and wherein the first sub-circuit includes a first power transistor and the second sub-circuit includes a second power transistor.

8. The integrated circuit of claim 5, wherein the switcher logic produces a changed state of a first prior signal before producing a changed state of the first signal, and wherein the switcher logic produces a changed state of a second prior signal before producing a changed state of the second signal.

9. The integrated circuit of claim 8, wherein the delay compensation circuit generates the changed state of the triggering signal in response to occurrence of the changed state of the first prior signal and in response to the amplitude of the varying signal.

10. The integrated circuit of claim 8, wherein the second delay compensation circuit generates the changed state of the second triggering signal in response to occurrence of the changed state of the second prior signal and in response to the amplitude of the varying signal.

11. An integrated circuit, comprising:
a driver stage disposed on a circuit-supporting substrate, the driver stage including:

switcher logic, coupled a clock circuit, for producing a first signal and a second signal during each cycle of a clock signal, wherein the switcher logic produces a changed state of a third signal prior to producing a changed state of the first signal, and wherein the switcher logic produces a changed state of a fourth signal prior to producing a changed state of the second signal, a first delay compensation circuit, coupled to the switcher logic, for producing a first triggering signal in response to the changed state of the third signal and an amplitude of an SW voltage, wherein the first triggering signal causes the switcher logic to produce the changed state of the fourth signal and the changed state of the second signal, and a second delay compensation circuit, coupled to the switcher logic, for producing a second triggering signal in response to the changed state of the fourth signal and the amplitude of the SW voltage, wherein the second triggering signal causes the switcher logic to produce the changed state of the third signal and the changed state of the first signal.

12. The integrated circuit of claim 11, wherein the first delay compensation circuit produces a changed state of the first triggering signal in response to a moment that a falling SW voltage passes through a first fixed DC reference voltage.

13. The integrated circuit of claim 12, wherein the second delay compensation circuit produces a changed state of the second triggering signal in response to a moment that a falling SW voltage passes through a second fixed DC reference voltage.

14. The integrated circuit of claim 13, in which the first delay compensation circuit includes an integrator, coupled to a sampler circuit, that integrates a voltage difference between a sampled SW voltage and the first fixed DC reference voltage, and outputs results of the integration, wherein a time constant of the integrator is greater than a period of the SW voltage.

15. The integrated circuit of claim 14, in which the first delay compensation circuit includes:
a waveform generator that generates a decreasing voltage, and
a comparator that has one input terminal for receiving the decreasing voltage generated by the waveform generator, an inverted input terminal for receiving the results of the integration, and an output terminal for outputting a signal that generates the first triggering signal.

16. The integrated circuit of claim 11, wherein the driver stage is a driver stage for a switched-mode power supply (SMPS), and wherein SW voltage is produced by the SMPS when the integrated circuit is coupled to the SMPS.

17. The integrated circuit of claim 16, wherein the SMPS includes a first power transistor and a second power transistor, and wherein an amplitude of the SW voltage varies as a result of turning on and off of the first power transistor and the second power transistor.

18. The integrated circuit of claim 17, wherein the switcher logic aligns a moment of turning on of the first power transistor and a moment of turning on of the second power transistor with a moment that the SW voltage sweeps through 0V.

19. The integrated circuit of claim 17, wherein the first power transistor includes a first MOSFET and the second power transistor includes a second MOSFET, wherein a conducting electrode of the first MOSFET and a conducting electrode of the second MOSFET are coupled to a node, and wherein the SMPS produces the SW voltage at the node.

20. The integrated circuit of claim 19, including:
a first buffer, for producing a first turn-on signal from the first signal, wherein the first turn-on signal is coupled to a control electrode of the first power transistor, and
a second buffer, for producing a second turn-on signal from the second signal, wherein the second turn-on signal is coupled to a control electrode of the second power transistor.

* * * * *